United States Patent
Ten Broeke et al.

(10) Patent No.: US 11,332,620 B2
(45) Date of Patent: May 17, 2022

(54) SOLUTION COMPRISING A DYE

(71) Applicant: NOURYON CHEMICALS INTERNATIONAL B.V., Arnhem (NL)

(72) Inventors: Raymond Albertus Johannes Ten Broeke, Raalte (NL); Maaike Anne Gertrud Ter Brake, Oldenzaal (NL); Koichi Tateishi, Chiba (JP); Johannes Hermanus Ter Beek, Lettele (NL); Auke Gerardus Talma, Bathmen (NL); Maria Steensma, Arnhem (NL); Geesje Klasina Spijkerman, Deventer (NL)

(73) Assignee: NOURYON CHEMICALS INTERNATIONAL B.V., Arnhem (NL)

( * ) Notice: Subject to any disclaimer, the term of this patent is extended or adjusted under 35 U.S.C. 154(b) by 67 days.

(21) Appl. No.: 16/980,043

(22) PCT Filed: Mar. 8, 2019

(86) PCT No.: PCT/EP2019/055809
§ 371 (c)(1),
(2) Date: Sep. 11, 2020

(87) PCT Pub. No.: WO2019/175040
PCT Pub. Date: Sep. 19, 2019

(65) Prior Publication Data
US 2021/0017389 A1     Jan. 21, 2021

(30) Foreign Application Priority Data
Mar. 13, 2018   (EP) .................................... 18161462

(51) Int. Cl.
| | | |
|---|---|---|
| *C09B 67/44* | (2006.01) | |
| *C09B 29/033* | (2006.01) | |
| *C09B 29/08* | (2006.01) | |
| *C08K 5/23* | (2006.01) | |
| *C08K 5/47* | (2006.01) | |

(52) U.S. Cl.
CPC ............ *C09B 67/0083* (2013.01); *C08K 5/23* (2013.01); *C08K 5/47* (2013.01); *C09B 29/0081* (2013.01); *C09B 29/0848* (2013.01)

(58) Field of Classification Search
CPC .................................................. C09B 67/0083
See application file for complete search history.

(56) References Cited

U.S. PATENT DOCUMENTS

| | | |
|---|---|---|
| 2006/0202158 A1 | 9/2006 | Chen et al. |
| 2007/0049650 A1 | 3/2007 | Araki |

FOREIGN PATENT DOCUMENTS

| | | |
|---|---|---|
| EP | 0989164 A1 | 3/2000 |
| WO | 2016153791 A1 | 9/2016 |

OTHER PUBLICATIONS

EPO, International Search Report issued in International Application No. PCT/EP2019/055809, dated Jun. 24, 2019.

*Primary Examiner* — Wenwen Cai
(74) *Attorney, Agent, or Firm* — Lorenz & Kopf, LLP

(57) ABSTRACT

Solution comprising about 1 to about 25 wt % of a dye that loses its colour during radical cure and about 75 to about 99 wt % of a solvent mixture, said solvent mixture comprising cyclopentanone and dimethylsulphoxide in a weight ratio of about 60:40 to about 95:5.

20 Claims, No Drawings

SOLUTION COMPRISING A DYE

CROSS-REFERENCE TO RELATED APPLICATION

This application is a U.S. National-Stage entry under 35 U.S.C. § 371 based on International Application No. PCT/EP2019/055809, filed Mar. 8, 2019, which was published under PCT Article 21(2) and which claims priority to European Application No. 18161462.9, filed Mar. 13, 2018, which are all hereby incorporated in their entirety by reference.

TECHNICAL FIELD

The present disclosure relates to a solution comprising a dye. The invention also relates to a peroxide formulation comprising said solution.

BACKGROUND

Radically curable resins, such as unsaturated polyester (UP) resins, vinyl ester (VE) resins and (meth)acrylate resins, are usually cured by mixing the resin with an organic peroxide formulation. In addition, a cure accelerator may be added to allow the cure to proceed at lower temperature.

It is generally not visible whether or not the organic peroxide has already been added and if so, whether its dispersion in the resin is homogeneous. For that purpose, peroxide formulations have been developed that contain a dye. The dye indicates the presence of the organic peroxide formulation in the resin, and shows whether or not the formulation is homogeneously dispersed.

If a dye is used that loses its colour during the cure (probably due to radicals attacking the chromophoric group), it is possible to monitor the cure by the fading colour. In addition, the dye will not affect the colour of the cured product.

Suitable dyes for this purpose are solid and need to be dissolved before incorporation in the peroxide formulation. However, these dyes are very difficult to dissolve in many solvents.

Solvents presently used for dissolving such dyes are N-ethyl pyrrolidone and N-methylpyrrolidone. These solvents, however, are classified as reprotoxic.

BRIEF SUMMARY

This disclosure provides a solution comprising:
about 1 to about 25 wt % of at least one dye having a structure according to one of the following formulae

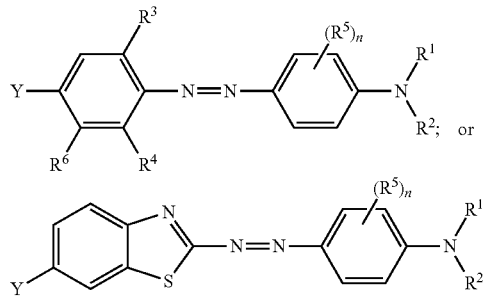

wherein
Y is $-NO_2$ or $-SO_2CH_3$
$R^1$ and $R^2$ are each independently chosen from $-C_xH_{2x+1}$, $-C_xH_{2x}-C\equiv N$, $-C_xH_{2x}-OH$, $-C_xH_{2x}-O-C(=O)-O-C_xH_{2x+1}$, $-C_xH_{2x}-O-C(=O)-C_xH_{2x+1}$, and $-C_xH_{2x}-C(=O)-O-C_xH_{2x+1}$, x being an integer of from about 1 to about 5,
$R^3$ is chosen from H, Cl, Br, $-NO_2$, $-OH$, and $-C\equiv N$,
$R^4$ and $R^6$ are each independently chosen from H, Cl, Br, $-NO_2$, $-OH$, and $-C\equiv N$, or may together form an aromatic or aliphatic ring,
n is an integer of from about 0 to about 3,
each $R^5$ is independently chosen from alkyl groups, alkoxy groups, halogens, amide groups, and sulphonamide groups,
about 75 to about 99 wt % of a solvent mixture, said solvent mixture comprising cyclopentanone and dimethylsulphoxide in a weight ratio of about 60:40 to about 95:5.

DETAILED DESCRIPTION

The following detailed description is merely exemplary in nature and is not intended to limit the disclosure or the application and uses of the subject matter as described herein. Furthermore, there is no intention to be bound by any theory presented in the preceding background or the following detailed description The object of the present disclosure is therefore the provision of a suitable solvent for such dyes that poses less health risks.

This object has been met by a solvent mixture comprising cyclopentanone and dimethylsulphoxide in a weight ratio of about 60:40 to about 95:5.

The present disclosure therefore relates to a solution comprising:
About 1 to about 25 wt % of at least about one dye having a structure according to one of the following formulae

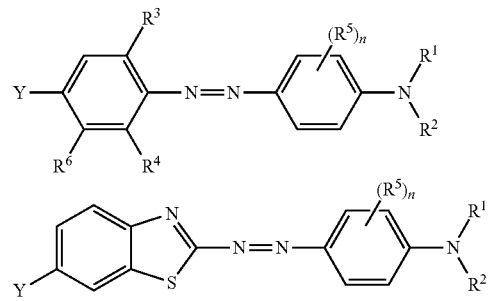

wherein
Y is $-NO_2$ or $SO_2CH_3$, typically $-NO_2$,
$R^1$ and $R^2$ are independently selected from $-C_xH_{2x+1}$, $-C_xH_{2x}-CN$, $-C_xH_{2x}-OH$, $-C_xH_{2x}-O-C(=O)-O-C_xH_{2x+1}$, $-C_xH_{2x}-O-C(=O)-C_xH_{2x+1}$, and $-C_xH_{2x}-C(=O)-O-C_xH_{2x+1}$, x being an integer in the range 1-5,
$R^3$ is selected from H, Cl, Br, $-NO_2$, $-OH$, and $-C\equiv N$, typically H,
$R^4$ and $R^6$ are independently selected from H, Cl, Br, $-NO_2$, $-OH$, and $-C\equiv N$, or may together form an aromatic or aliphatic ring, $R^4$ and $R^6$ typically being H,
n is an integer in the range of about 0 to about 3, typically n=0, each $R^5$ is independently selected from alkyl groups, alkoxy groups, halogens, amide groups, and sulphonamide ($-N(H)SO_2CH_3$) groups, About 75 to about 99 wt % of a solvent mixture, said solvent mixture comprising cyclopentanone and dimethylsulphoxide in a weight ratio of about 60:40 to about 95:5.

In the above formulae, $R^1$ and $R^2$ are independently selected from $-C_xH_{2x+1}$, $-C_xH_{2x}-C\equiv N$, $-C_xH_{2x}-OH$, $-C_xH_{2x}-O-C(=O)-O-C_xH_{2x+1}$, $-C_xH_{2x}-O-C(=O)-C_xH_{2x+1}$, and $-C_xH_{2x}-C(=O)-O-C_xH_{2x+1}$, x being an integer in the range of about 1 to about 5, typically about 1 to about 2. Specifically preferred $R^1$ groups are $-C_xH_{2x+1}$ and $-C_xH_{2x}-C\equiv N$, more typically $-CH_2CH_3$ and $-CH_2-CH_2-C\equiv N$.

Specifically preferred $R^2$ groups are $-C_xH_{2x}-O-C(=O)-O-C_xH_{2x+1}$ and $-C_xH_{2x}-O-C(=O)-C_xH_{2x+1}$. Specifically preferred examples are $-C_2H_4-O-C(=O)-O-C_2H_5$ and $-C_2H_4-O-C(=O)-CH_3$.

Specific examples of suitable dyes with formula

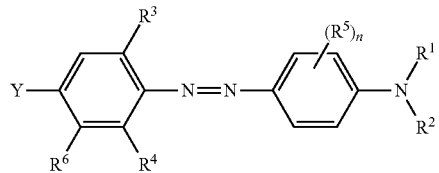

are:

Disperse Blue 79, i.e. 2-[5-acetamido-N-(2-acetyloxyethyl)-4-[(2-bromo-4,6-dinitrophenyl)diazenyl]-2-ethoxyanilino] ethyl acetate, in which $Y=-NO_2$, $R^1=R^2=-C_2H_4-O-C(=O)-CH_3$, $R^3$=Br, $R^4=NO_2$, n=2, one $R^5$ is $-O-C_2H_5$; the other is $-N(H)-C(=O)-CH_3$, $R^6$=H.

Disperse Brown 1, i.e. 2-[3-chloro-4-[(2,6-dichloro-4-nitrophenyl)diazenyl]-N-(2-hydroxyethyl)anilino]ethanol, in which $Y=-NO_2$, $R^1=R^2=-C_2H_4-OH$, $R^3=R^4$=Cl, n=1, $R^5$=Cl, $R^6$=H.

Disperse Violet 24, i.e. 2-[[4-[2-(2-Bromo-4,6-dinitrophenyl)diazenyl]-3-methyl phenyl]butylamino]ethanol, in which $Y=-NO_2$, $R^1=C_4H_9$, $R^2=-C_2H_4-OH$, $R^3$=Br, $R^4=NO_2$, n=1, $R^5=CH_3$, $R^6$=H.

Disperse Red 73, i.e. 2-[[4-[2-cyanoethyl(ethyl)amino]phenyl]diazenyl]-5-nitrobenzonitrile, in which $Y=-NO_2$, $R^1=C_2H_5$, $R^2=-C_2H_4-C\equiv N$, $R^3$=H, $R^4=-C\equiv N$, n=0, $R^6$=H.

Disperse Orange 25, i.e. 3-[N-Ethyl-4-(4-nitrophenylazo)phenylamino]propionitrile, in which $Y=-NO_2$, $R^1=C_2H_5$, $R^2=-C_2H_4-C\equiv N$, $R^3=R^4$=H, n=0, $R^6$=H.

Disperse Red 1, i.e. N-Ethyl-N-(2-hydroxyethyl)-4-(4-nitrophenylazo)aniline, in which $Y=-NO_2$, $R^1=C_2H_5$, $R^2=-C_2H_4-OH$, $R^3=R^4$=H, n=0, $R^6$=H.

Specific examples of suitable dyes with formula

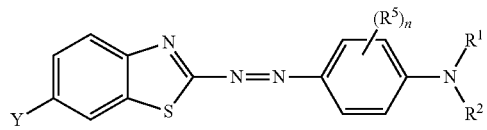

are:

Disperse Blue 148, i.e. methyl N-ethyl-N-(4-((5-nitro-2,1-benzisothiazol-3-yl)azolphenyl)-beta-alaninate, in which $Y=-NO_2$, $R^1=C_2H_5$, $R^2=-C_2H_4-C(=O)-O-CH_3$, n=0

Disperse Red 177, i.e. 2-((2-cyanoethyl)(4-((6-nitrobenzothiazol-2-yl)azo)phenyl)amino)ethyl acetate, in which $Y=-NO_2$, $R^1=-C_2H_4-C\equiv N$, $R^2=-C_2H_4-O-C(=O)-CH_3$, n=0

Disperse Red 179, i.e. 3-[N-ethyl-[3-methyl-4-(6-nitrobenzothiazol-2-yl)diazenyl-phenyl]amino]propanenitrile, in which $Y=-NO_2$, $R^1=C_2H_5$, $R^2=-C_2H_4-C\equiv N$, n=1, and $R^5=CH_3$ Disperse Red 145, i.e. 3-[N-ethyl-4-[(6-nitro-1,3-benzothiazol-2-yl)diazenyl]anilino]propanenitrile, in which $Y=-NO_2$, $R^1=C_2H_5$, $R^2=-C_2H_4-C\equiv N$, n=0

Disperse Red 154, i.e. 2-[2-cyanoethyl][4-[6-nitrobenzothiazol-2-yl)azo]phenyl]amino]ethyl carbonate, in which $Y=-NO_2$, $R^1=-C_2H_4-C\equiv N$, $R^2=-CH_2CH_2-O-C(=O)-O-C_2H_5$, n=0

Disperse Red 177, i.e. 3-[[2-(acetyloxy)ethyl][4-[2-(6-nitro-2-benzothiazolyl)diazenyl]phenyl]amino]propanenitrile, in which $Y=-NO_2$, $R^1=-C_2H_4-C\equiv N$, $R^2=-CH_2CH_2-O-C(=O)-CH_3$, n=0

The latter two dyes, i.e. Disperse Red 154 and Disperse Red 177, are the preferred dyes for use in the present disclosure. These dyes are the most compatible with organic peroxides and have the best discoloration properties.

The solution according to the present disclosure ("the dye-containing solution") comprises about 1 to about 25 wt %, typically about 2 to about 20 wt %, and typically about 5 to about 15 wt % of the dye, dissolved in a mixture cyclopentanone and dimethylsulphoxide (DMSO).

Said mixture comprises cyclopentanone and dimethylsulphoxide in a cyclopentanone:dimethylsulphoxide weight ratio of about 60:40 to about 95:5, typically about 70:30 to about 90:10, typically about 70:30 to about 80:20.

Said solvent mixture typically includes solely of cyclopentanone and dimethylsulphoxide.

The present disclosure also relates to a peroxide formulation comprising:

one or more organic peroxides and

About 0.05 to about 2.0 wt %, typically about 0.1 to about 1.5 wt %, typically about 0.2 to about 1.0 wt % of the dye-containing solution described above, wherein the active oxygen content of the formulation is the range of about 2 to about 15 wt %, typically about 4 to about 12 wt %, and typically about 6 to about 10 wt %.

The active oxygen content of the formulation can be determined by iodometric titration, according to ASTM D2180-89(2008).

Examples of suitable organic peroxides are ketone peroxides, organic hydroperoxides, peroxyesters, and combinations thereof.

Examples of ketone peroxides are acetylacetone peroxide (AAP), methyl ethyl ketone peroxide (MEKP), methyl isopropyl ketone peroxide (MiPKP), cyclohexanone peroxide, cyclopentanone peroxide, methyl isobutyl ketone peroxide (MiBKP), and combinations thereof. Ketone peroxides can have the formula

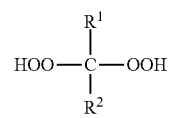

or the formula

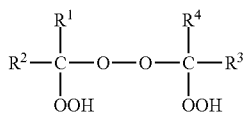

These formulae represent methyl isopropyl ketone peroxide when $R^1$ and $R^4$ are methyl and $R^2$ and $R^3$ are isopropyl. They represent methyl ethyl ketone peroxide when $R^1$ and $R^4$ are methyl and $R^2$ and $R^3$ are ethyl. They represent methyl isobutyl ketone peroxide when $R^1$ and $R^4$ are methyl and $R^2$ and $R^3$ are isobutyl. They represent cyclohexanone peroxide when $R^1$ and $R^2$ are linked to form a cyclohexane ring and $R^3$ and $R^4$ are linked to form a cyclohexane ring. They represent cyclopentanone peroxide when $R^1$ and $R^2$ are linked to form a cyclopentane ring and $R^3$ and $R^4$ are linked to form a cyclopentane ring.

The first formula reflects a so-called type-4 (T4) ketone peroxide; the second formula a so-called type-3 (T3) ketone peroxide. Both types are generally present in ketone peroxide formulations, in addition to hydrogen peroxide.

Examples organic hydroperoxides are cumyl hydroperoxide (CHP), isopropyl cumyl hydroperoxide, 1,1,3,3-tetramethylbutyl hydroperoxide, tert-butyl hydroperoxide (TBHP), tert-amyl hydroperoxide, pinane hydroperoxide, para-menthane hydroperoxide, and combinations thereof.

Examples of peroxyesters are tert-butyl peroxybenzoate (TBPB), tert-butyl peroxy-2-ethylhexanoate, 2,5-dimethyl-2,5-di(2-ethylhexanoylperoxy)hexane, tert-butylperoxy-3,5,5-trimethylhexanoate, and combinations thereof.

In addition to the peroxide and the dye-containing solution, other compounds may be present in the peroxide formulation, such as an organic solvent other than cyclopentanone and dimethylsulphoxide. This solvent may serve as a diluent/phlegmatizer for the organic peroxide. Suitable solvents are compatible with cyclopentanone and dimethylsulphoxide and at the same time are able to stabilize organic peroxides. Examples of suitable solvents are phthalates, such as dimethyl phthalate or diisononyl phthalate, 2,2,4-trimethyl pentanediol diisobutyrate (TXIB), mineral spirits, diacetone alcohol, and methylbenzoate.

Furthermore, other materials such as diethyl acetoacetamide, 2,4-pentanedione, water, residual ketone, $H_2O_2$, and fillers (e.g. silica or clay) may be present in the peroxide formulation.

The disclosure further relates to a process for curing a radically curable resin using the peroxide formulation.

Suitable radically curable resins to be cured according to the disclosure include alkyd resins, unsaturated polyester (UP) resins, vinyl ester resins, and (meth)acrylate resins. Preferred resins are (meth)acrylate resins, UP resins, and vinyl ester resins. The radically curable resin may be combined with other types of resins, such as epoxy resins.

In the context of the present application, the terms "unsaturated polyester resin" and "UP resin" refer to the combination of unsaturated polyester resin and ethylenically unsaturated monomeric compound. The term "vinyl ester resin" refers to a resin produced by the esterification of an epoxy resin with an unsaturated monocarboxylic acid, and dissolved in an ethylenically unsaturated monomeric compound (e.g. styrene). UP resins and vinyl ester resins as defined above are well known and commercially available.

Suitable UP resins to be cured by the process of the present disclosure are so-called ortho-resins, iso-resins, iso-npg resins, and dicyclopentadiene (DCPD) resins. Examples of such resins are maleic, fumaric, allylic, vinylic, and epoxy-type resins, bisphenol A resins, terephthalic resins, and hybrid resins.

Acrylate and methacrylate resins without an additional ethylenically unsaturated monomeric compound like styrene are referred to in this application as (meth)acrylate resins.

Examples of suitable ethylenically unsaturated monomers to be present in UP and vinyl ester resins include styrene and styrene derivatives like α-methyl styrene, vinyl toluene, indene, divinyl benzene, vinyl pyrrolidone, vinyl siloxane, vinyl caprolactam, stilbene, but also diallyl phthalate, dibenzylidene acetone, allyl benzene, methyl methacrylate, methylacrylate, (meth)acrylic acid, diacrylates, dimethacrylates, acrylamides; vinyl acetate, triallyl cyanurate, triallyl isocyanurate, allyl compounds which are used for optical application (such as (di)ethylene glycol diallyl carbonate), chlorostyrene, tert-butyl styrene, tert-butylacrylate, butanediol dimethacrylate, and mixtures thereof. Suitable examples of (meth)acrylate reactive diluents are PEG200 di(meth)acrylate, 1,4-butanediol di(meth)acrylate, 1,3-butanediol di(meth)acrylate, 2,3-butanediol di(meth)acrylate, 1,6-hexanediol di(meth)acrylate and its isomers, diethylene glycol di(meth)acrylate, triethylene glycol di(meth)acrylate, glycerol di(meth)acrylate, trimethylol propane di(meth)acrylate, neopentyl glycol di(meth)acrylate, dipropylene glycol di(meth)acrylate, tripropylene glycol di(meth)acrylate, PPG250 di(meth)acrylate, tricyclodecane dimethylol di(meth)acrylate, 1,10-decanediol di(meth)acrylate, tetraethylene glycol di(meth)acrylate, trimethylol propane tri(meth)acrylate, glycidyl (meth)acrylate, bismaleimides, bis-citraconimides, bisitaconimides, monoitaconimides, monocitraconimides, monocitraconimides containing a functional group—e.g. an additional unsaturated functionality, for example n-allylcitraconimides—and mixtures thereof.

The amount of ethylenically unsaturated monomer to be used is typically at least about 0.1 wt %, based on the weight of the resin, typically at least about 1 wt %, and typically at least about 5 wt %. The amount of ethylenically unsaturated monomer is typically not more than about 50 wt %, typically not more than about 40 wt %, and typically not more than about 35 wt %.

The amount of peroxide formulation to be used in the curing process is typically at least about 0.1 wt %, typically at least about 0.5 wt %, and typically at least about 1 wt %, based on the weight of resin. The amount of peroxide formulation is typically not more than about 8 wt %, typically not more than about 5 wt %, typically not more than about 2 wt %, based on the weight of resin.

Other optional additives may be employed in the curing process according to the disclosure, such as cure accelerators, fillers, glass fibres, pigments, inhibitors, and promoters.

In the curing process of the present disclosure, the resin is first mixed with the monomer. The peroxide formulation can be added directly to the resulting mixture. However, it can also be first mixed with the monomer or resin.

The curing process can be carried out at any temperature from about −5° C. up to about 250° C. Typically, it is carried out at ambient temperatures commonly used in applications such as hand lay-up, spray-up, filament winding, resin transfer moulding, coating (e.g. gel-coat and standard coatings), button production, centrifugal casting, corrugated sheets or flat panels, relining systems, kitchen sinks via pouring compounds, etc. However, it can also be used in SMC, BMC, pultrusion techniques, and the like, for which temperatures up to about 180° C., typically up to about 150° C., typically up to about 100° C. are used.

EXAMPLES

Example 1—Solubility in Various Solvents 1.0 gram of Disperse Red 154 powder was stirred for 30 minutes in 9.0 g solvent or solvent mixture. Samples of the resulting mixture were subsequently stored for at least about 12 hours at different temperatures: −15° C., 5° C., and 20° C.
After storage, the mixture was filtered. The residue was dried and its weight was determined.

TABLE 1 solubility in different solvents

| | Solubility (wt %) | | |
|---|---|---|---|
| | −15° C. | 5° C. | 20° C. |
| DMSO | froze | froze | >10 |
| Cyclopentanone (CP) | 7.34 | 8.40 | 9.35 |
| Cylcohexanone (CH) | 3.79 | 4.19 | 4.68 |
| Propylene carbonate (PC) | 2.24 | 2.22 | 2.41 |
| Dimethylphthalate (DMP) | 2.13 | 2.15 | 2.26 |
| Poly(methyl acrylate) (PMA) | 1.58 | 1.56 | 1.66 |
| Diacetone alcohol (DAA) | 0.87 | 0.88 | 1.11 |
| Trimethyl Pentanyl Diisobutyrate (TXIB) | 0.67 | 0.69 | 0.91 |
| PC/DAA (90/10) | —[1] | — | 2.69 |
| PC/DAA (80/20) | — | — | 2.79 |
| PC/DAA (50/50) | 1.89 | 1.77 | 2.54 |
| PC/PMA (50/50) | 1.50 | 2.17 | 2.25 |
| DMP/TXIB (50/50) | — | — | 1.50 |
| CP/DMSO (90/10) | 8.89 | — | 11.58 |
| CP/DMSO (80/20) | 10.11 | — | 12.60 |
| CP/DMSO (70/30) | 12.57 | — | 13.98 |
| CP/DMSO (50/50) | froze | 9.67 | 9.66 |
| CP/DEG[2] | — | — | 7.78 |
| CP/TEP[3] (50/50) | — | — | 7.68 |
| CH/DAA (80/20) | — | — | 4.78 |
| CH/DAA (50/50) | | | 3.28 |

[1]— = not analysed
[2]DEG = diethylene glycol
[3]TEP = triethyl phosphate

Example 2

2.5 grams of Disperse Red 177 powder was stirred for 24 hours at room temperature in 22.5 grams of a CP/DMSO 80/20 mixture. Disperse Red 177 completely dissolved.

Example 3

2.5 gram of Disperse Red 1 powder was stirred for 24 hours at room temperature, followed by 4 hours at 40° C., in 22.5 grams of a CP/DMSO 80/20 mixture. Disperse Red 1 completely dissolved.

Example 4—Chemical Stability of Peroxide Formulations

Peroxide formulations were prepared by adding 0.2 g of a freshly made solution of 10 wt % Disperse Red 154 in 80/20 CP/DMSO to 100 g of different peroxide formulations.
The formulations were stored in 30 ml glass bottles for about 4 or 8 weeks at 30° C. or 40° C.
After storage, the decrease in total active oxygen content was determined by way of iodometric titration according to ASTM D2180-89(2008). Samples having a decrease in total active oxygen content of >10% after eight weeks storage at 40° C. are considered unstable.

TABLE 1

Relative active oxygen loss (%) after t = weeks/temperature

| Peroxide | Dye sol. (wt %) | 4 wks 30° C. | 4 wks 40° C. | 8 wks 30° C. | 8 wks 40° C. |
|---|---|---|---|---|---|
| Butanox ® M-50 50% MEKP in dimethyl phthalate | 0.2 | 0.7 | 1.6 | 0.5 | 2.3 |
| Trigonox ® 75 VRN MEKP and TBHP in dimethyl phthlate | 0.2 | 0.0 | 0.4 | 0.1 | 1.3 |
| Trigonox ® 44B 33% AAP in DEG, water, and diactone alcohol | 0.2 | 0.7 | 3.7 | 0.7 | 6.9 |
| Trigonox ® 239 45%CHP in solvent mixture | 0.4 | 0.6 | 4.7 | 1.3 | 7.3 |
| Butanox ® P-50 50% MiPKP in dimethyl phthalate | 0.2 | 0.8 | 2.6 | 1.1 | 6.1 |
| Cadox ® D-50 50% MEKP in TXIB | 0.5 | 0.2 | 0.7 | 0.3 | 4.8 |
| Cadox ® D-50 50% MEKP in TXIB | 1.1 | 0.3 | 0.9 | 0.3 | 8.4 |
| Cadox ® L-50A 50% MEKP in TXIB | 0.5 | 0.1 | 0.6 | 0.2 | 7.5 |
| Cadox ® M-50A 50% MEKP in TXIB | 0.5 | 0.1 | 0.4 | 0.2 | 1.9 |
| Butanox ® M-60 60% MEKP in dimethyl phthalate | 0.1 | — | — | 0.6 | 1.8 |
| Butanox ® LPT-IN MEKP in diisononyl phthalate | 0.2 | — | — | 0.35 | 1.4 |
| Trigonox ® 249 MEKP and CHP in dimethyl phthalate | 0.2 | — | — | 0.4 | 1.5 |
| Trigonox ® 289 MEKP and CHP in dimethyl phthalate and methyl benzoate | 0.2 | — | — | 0 | 0.6 |
| Trigonox ® V388 MEKP in solvent mixture | 0.2 | — | — | 1.1 | 4.7 |

Example 5

A gelcoat was cured with Butanox M-50, with and without 0.2 wt % of the 10 wt % Disperse Red 154 in 80/20 CP/DMSO solution. The colour of the mold- and back side of the resulting gel coat was following in time using an X-rite Color I-5. It showed that red colour of the mould side disappeared completely during the curing reaction; the back side did retain some red colour after cure, which faded completely after one month of storage.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the various embodiments in any way. Rather, the foregoing detailed description will provide those skilled in the art with a convenient road map for implementing an exemplary embodiment as contemplated herein. It being understood that various changes may be made in the function and arrangement of elements described in an exemplary embodiment without departing from the scope of the various embodiments as set forth in the appended claims.

What is claimed is:

1. A solution comprising:
about 1 to about-25 wt % of at least one dye having a structure according to one of the following formulae

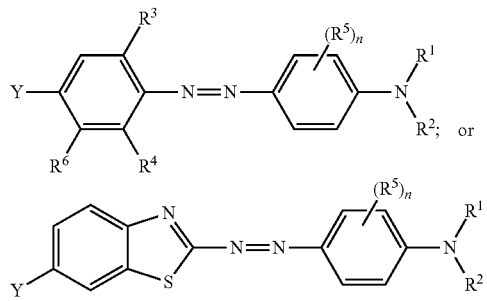

wherein
Y is —NO$_2$ or —SO$_2$CH$_3$
R$^1$ and R$^2$ are each independently selected from the group consisting of —C$_x$H$_{2x+1}$, —C$_x$H$_{2x}$—C≡N, —C$_x$H$_{2x}$—OH, —C$_x$H$_{2x}$—O—C(=O)—O—C$_x$H$_{2x+1}$, —C$_x$H$_{2x}$—O—C(=O)—C$_x$H$_{2x+1}$, and —C$_x$H$_{2x}$—C(=O)—O—C$_x$H$_{2x+1}$, x being an integer of from 1 to 5,
R$^3$ is selected from the group consisting of from H, Cl, Br, —NO$_2$, —OH, and —C≡N,
R$^4$ and R$^6$ are each independently selected from the group consisting of H, Cl, Br, —NO$_2$, —OH, and —C≡N, or may together form an aromatic or aliphatic ring,
n is an integer of from 0 to 3,
each R$^5$ is independently selected from the group consisting of alkyl groups, alkoxy groups, halogens, amide groups, and sulphonamide groups,
about 75 to about 99 wt % of a solvent mixture, said solvent mixture comprising cyclopentanone and dimethylsulphoxide in a weight ratio of about 60:40 to about 95:5.

2. The solution according to claim 1 wherein the dye has the formula

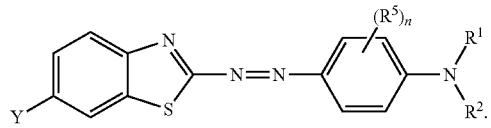

3. The solution according to claim 2 wherein Y is —NO$_2$.

4. The solution according to claim 2 wherein R$^1$ has the structure —C$_x$H$_{2x}$ C≡N.

5. The solution according to claim 2 wherein R$^2$ has the structure C$_x$H$_{2x+1}$.

6. The solution according to claim 2 wherein R$^2$ has the structure —C$_x$H$_{2x}$—O—C(=O)—O—C$_x$H$_{2x+1}$.

7. The solution according to claim 2 wherein R$^2$ has the structure —C$_x$H$_{2x}$—O—C(=O)—C$_x$H$_{2x+1}$.

8. The solution according to claim 1 wherein the dye has the formula

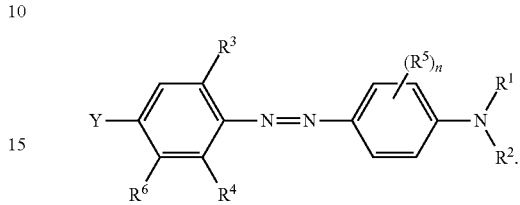

9. The solution according to claim 8 wherein Y is —NO$_2$.

10. The solution according to claim 8 wherein either R$^1$ or R$^2$ has the structure —C$_x$H$_{2x}$—C≡N.

11. The solution according to claim 8 wherein R$^1$ has the structure C$_x$H$_{2x+1}$.

12. The solution according to claim 8 wherein R$^2$ has a structure selected from the group consisting of —C$_x$H$_{2x}$—OH, —C$_x$H$_{2x}$—O—C(=O)—O—C$_x$H$_{2x+1}$, —C$_x$H$_{2x}$—O—C(=O)—C$_x$H$_{2x+1}$, and —C$_x$H$_{2x}$—C(=O)—O—C$_x$H$_{2x+1}$.

13. The solution according to claim 2, wherein R$^1$ is ethyl or —CH$_2$—CH$_2$—C≡N; wherein R2 is —C$_2$H$_4$—O—C(=O)—O—C$_2$H$_5$ or —C$_2$H$_4$—O—C(=O)—CH$_3$.

14. The solution according to claim 8 wherein either R$^1$ or R$^2$ has the structure —CH$_2$—CH$_2$—C≡N.

15. The solution according to claim 8 wherein R$^1$ is ethyl.

16. A peroxide formulation comprising:
one or more organic peroxides and
about 0.05 to about 2.0 wt % of the solution according to claim 1,
wherein the active oxygen content of the peroxide formulation is from about 2 to about 15 wt %.

17. The peroxide formulation according to claim 16 wherein the organic peroxide is selected from the group consisting of ketone peroxides, organic hydroperoxides, peroxyesters, and combinations thereof.

18. The peroxide formulation according to claim 16 wherein the organic peroxide is selected from the group consisting of acetylacetone peroxide, tert-butyl peroxybenzoate, methyl ethyl ketone peroxide, methyl isopropyl ketone peroxide, cumyl hydroperoxide, and combinations thereof.

19. A process for curing a radically curable resin comprising a step of adding the peroxide formulation according to claim 16 to the radically curable resin.

20. The process according to claim 19 wherein the resin is selected from the group consisting of unsaturated polyester (UP) resins, vinyl ester (VE) resins, and (meth)acrylate resins.

* * * * *